United States Patent [19]
Havemann

[11] Patent Number: 5,565,384
[45] Date of Patent: Oct. 15, 1996

[54] SELF-ALIGNED VIA USING LOW PERMITTIVITY DIELECTRIC

[76] Inventor: Robert H. Havemann, 7413 Stillwater Ct., Garland, Tex. 75044

[21] Appl. No.: 234,100

[22] Filed: Apr. 28, 1994

[51] Int. Cl.$^6$ .................................. H01L 21/311
[52] U.S. Cl. .................... 437/228; 437/231; 437/235; 148/DIG. 51; 156/653.1; 430/317
[58] Field of Search .................. 437/231, 228 M, 437/228 ES, 962, 195, 235; 148/DIG. 51, DIG. 106; 430/314, 316, 317; 156/653.1

[56] References Cited

U.S. PATENT DOCUMENTS

| | | |
|---|---|---|
| 3,985,597 | 10/1976 | Zielinski . |
| 4,367,119 | 1/1983 | Logan et al. ............... 156/653.1 |
| 4,432,035 | 2/1984 | Hsieh et al. ............... 361/322 |
| 4,576,900 | 3/1986 | Chiang ................. 430/313 |
| 4,683,024 | 7/1987 | Miller et al. ............... 437/231 |
| 4,723,978 | 2/1988 | Clogdo et al. ............. 156/643.1 |
| 4,789,648 | 12/1988 | Chow et al. ............... 437/195 |
| 5,103,288 | 4/1992 | Sakamoto et al. ........... 437/203 |
| 5,110,712 | 5/1992 | Kessler et al. ............ 430/317 |
| 5,141,817 | 8/1992 | Babich et al. ............. 428/447 |
| 5,143,820 | 9/1992 | Kotecha et al. ........... 430/314 |
| 5,155,576 | 10/1992 | Mizushima ................. 357/71 |
| 5,198,298 | 3/1993 | Haskell et al. ............ 428/336 |
| 5,246,883 | 9/1993 | Lin et al. ................ 437/195 |
| 5,371,047 | 12/1994 | Greco et al. ............. 437/238 |
| 5,393,712 | 2/1995 | Rostoker et al. .......... 437/235 |

FOREIGN PATENT DOCUMENTS

| | | |
|---|---|---|
| 103879 | 3/1984 | European Pat. Off. . |
| 0296707 | 12/1988 | European Pat. Off. . |
| 3345 | 6/1985 | Germany . |
| 61-268037 | 11/1986 | Japan . |
| 63-208248 | 8/1988 | Japan . |
| 63-276246 | 11/1988 | Japan . |
| 3-105923 | 5/1991 | Japan . |
| 4-127454 | 4/1992 | Japan . |
| 4-311059 | 11/1992 | Japan . |

OTHER PUBLICATIONS

Y. Misawa, et al., IEEE Trans. Electron Dev., ED34(3) (1987) 621, ". . . Multilayered dielectrics of plasma SiO and . . . polyimide".
Translations of JP 3–105923, 4–311059 and 4–127454.
S. Wolf, "Silicon Processing For the VLSI Era" vol. II, pp. 214–217.

*Primary Examiner*—Chandra Chaudhari
*Assistant Examiner*—Leon Radomsky

[57] ABSTRACT

A semiconductor device and process for making the same which reduces capacitance between adjacent conductors on a connection layer, reduces overetching due to via misalignment or uneven device topography, and maintains a rigid structure with good heat transfer characterisitics. In one embodiment, horizontal gaps between the patterned conductors 18 and 44 are substantially filled with an organic-containing dielectric material (Allied Signal 500 Series, for example) 22 and 54. Inorganic dielectric layers 24 and 56 are formed over organic-containing dielectric layers 22 and 54, respectively, from a material such as silicon dioxide. Vias are etched through the inorganic dielectric layers using an etch process such as fluorocarbons in a high density plasma which does not appreciably etch the organic-containing dielectric material.

20 Claims, 4 Drawing Sheets

SELF-ALIGNED VIA USING LOW PERMITTIVITY DIELECTRIC

FIELD OF THE INVENTION

This invention relates generally to the fabrication of semiconductor devices, and more particularly to self-aligned connections between layers of conductors on semiconductor devices and processes for making the same.

BACKGROUND OF THE INVENTION

Semiconductors are widely used in integrated circuits for electronic devices such as computers and televisions. These integrated circuits typically combine many transistors on a single crystal silicon chip to perform complex functions and store data. Increasing the functionality or capacity of a given circuit generally requires a corresponding increase in the number of transistors which must be integrated on a single chip. This increase is often accomplished by decreasing the size of transistors and other devices contained on a chip. As the size and distance between individual devices on a chip diminish, the technical challenges related to design and production of the circuit multiply.

One of the challenges in scaling VLSI (very large scale integration) circuit designs is coping with decreased mask alignment tolerance. Devices on a typical circuit are connected by two or more patterned layers of conductors, each separated from the others by insulating layers, or interlayer dielectrics. Vias are holes formed in an interlayer dielectric to allow electrical connections to the conductors or devices below the insulator. Masks are used to create a pattern for each layer of conductors and to create a pattern for the vias passing through the interlayer dielectric. If the masks are not aligned to each other, the vias may only partially expose the desired conductor or device. If the misalignment is severe, some connections will be shorted to other conductors or left open, and the circuit will not operate. Conventionally, this problem is solved by designing tolerance into the via connections, which requires more space on the chip, or by use of more elaborate mask alignment procedures and equipment.

A second challenge in VLSI design is the control of capacitance between adjacent conductors. In one aspect, capacitance is a measure of the ability of a signal travelling along one conductor to produce an undesirable signal (crosstalk) in a neighboring conductor. This may result in a limitation on the ultimate speed of the device, among other things. Generally, a capacitance effect exists between any two conducting regions separated by an insulator. The capacitance is directly related to the common area of the conducting regions, as well as to the dielectric constant of the insulator between them. The capacitance also increases as the distance between the two conducting regions is decreased.

Conventional semiconductor fabrication uses silicon dioxide or similar insulating materials as both a gap filler between adjacent conductors at the same level and as an interlayer insulator. Silicon dioxide has a dielectric constant of about 3.9. This constant is based on a scale where 1.0 represents the dielectric constant of a vacuum. Various materials exhibit dielectric constants from very near 1.0 to values in the hundreds. As used herein, the term low-k will refer to a material with a dielectric constant less than 3.5.

There exists a need for processes that can produce semiconductor devices with a satisfactory low-k material as an insulator between adjacent conductors. Unfortunately, many other factors besides dielectric constant have affected the maturation of such a process. For example, structural rigidity, method of application, temperature constraints, response to etchants, heat transfer, contamination of surrounding structure, and shrinkage are some of the factors which must also be considered when selecting new dielectric materials or processes. Several techniques have been attempted in an effort to solve this problem. One proposed technique uses a material containing hollow spheres, the air in the spheres serving to decrease the dielectric constant of the material. One of the major problems with this technique is the manufacture of such spheres at a size small enough to easily flow between conductors spaced at a fraction of a micron. Another proposed technique uses various porous materials, including porous oxides. The etching of such materials is very hard to control because of their inherent permeability. Furthermore, they tend to possess poor structural characteristics. Dielectrics formed from polymers or organics have several drawbacks, including low temperature constraints which can limit further processing steps, lack of structural rigidity, poor heat transfer, and etching problems. In particular, several candidates which appear promising have been affected by uncontrollability of the etching process.

SUMMARY OF THE INVENTION

Several problems related to continued miniturization of integrated circuits, including decreased mask alignment tolerance, increased capacitance between adjacent conductors, and poor heat transfer and structural rigidity of low-k candidates, have been described above. The present invention is apparently the first semiconductor fabrication procedure to combine solutions to many of these problems simultaneously: organic-containing low-k dielectric materials are used as a gap filler between horizontally adjacent conductors, thereby decreasing line-to-line capacitance; the same organic-containing layer possesses etch-stopping properties which may be utilized to compensate for via misalignment problems; and the majority of the interlayer dielectric is constructed from oxide or other common dielectrics which possess good heat transfer and structural characteristics.

The present invention is a method of fabricating vias for electrical connections between layers on semiconductor devices. The method can comprise the forming of a layer of patterned conductors, and the forming of an organic-containing dielectric layer spanning at least 50% of the space between at least two of the patterned conductors, with the organic-containing layer having a thickness between 50% and 150% the thickness of the patterned conductors, and a dielectric constant less than 3.5. The method can further comprise depositing an inorganic dielectric layer covering the organic-containing dielectric layer and any exposed portions of the patterned conductors, and etching vias through the inorganic dielectric with an etchant which is selective to the inorganic dielectric layer. In this process, the organic-containing dielectric layer acts as an etch stop, preventing overetching due to either misalignment between the vias and the patterned conductors, or uneven topography across the semiconductor device while reducing line-to-line capacitance as compared to a silicon dioxide dielectric.

The method of this invention can be applied to any interconnection layer of patterned conductors on a semiconductor device. It can also be applied where the patterned conductors are part of the polysilicon layer which also forms the gate top plates of field effect transistors integrated into the semiconductor device. Preferably, the inorganic dielectric layer is composed of more than 95% silicon dioxide, silicon nitride, or combinations thereof. Preferably, the organic-containing layer is composed of a material containing 10% to 100% organic material by weight, and the organic material is a polymer, such as polyimide. Alternately, the organic-containing layer may be comprised of at least two sublayers, including an organic sublayer over a low-k inorganic sublayer, where the low-k inorganic layer is, e.g., a porous oxide.

BRIEF DESCRIPTION OF THE DRAWINGS

This invention, including the features and advantages thereof, can be best understood by reference to the following drawings, wherein.

DETAILED DESCRIPTION OF THE PREFERRED EMBODIMENTS

Figure 1A:
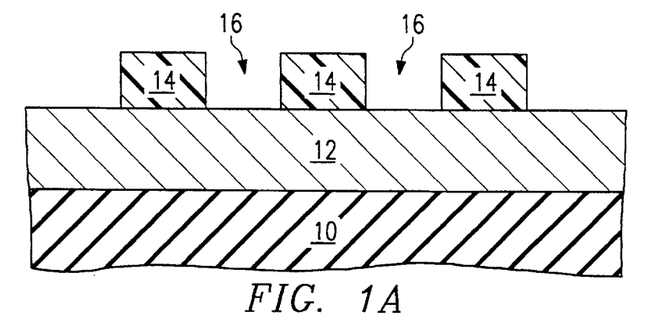
FIG. 1A–1D are cross-sectional views showing the progressive steps in the fabrication of an interconnection layer of patterned conductors, organic-containing and inorganic dielectric layers, and a via to one of the conductors, where the organic-containing layer completely covers the patterned conductors.
Figure 1B:
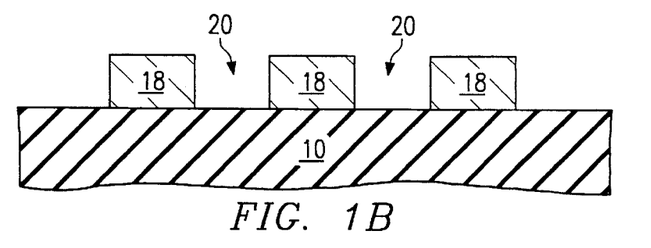
Figure 1C:
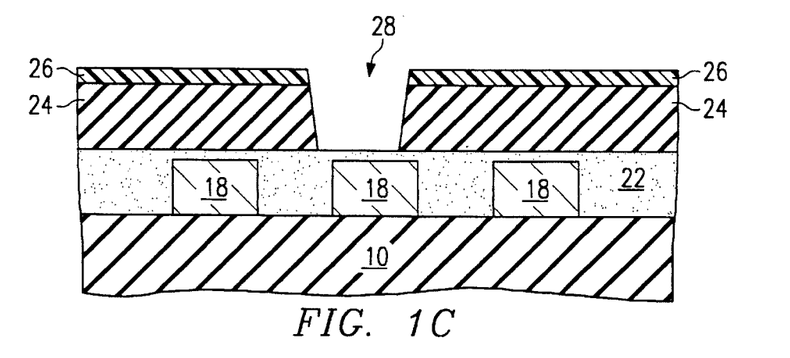
Figure 1D:
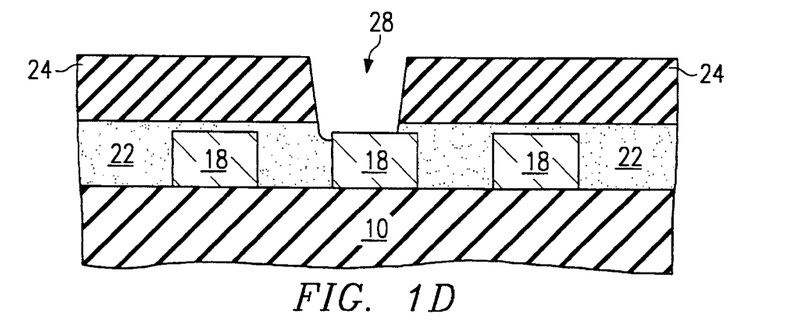

In one embodiment, this invention provides a method for fabricating self-aligned vias between interconnection layers of patterned conductors on a semiconductor device, using a layer of organic-containing material which fills the space between and completely covers the conductors. The method of this embodiment is illustrated in FIG. 1. With reference to FIG. 1A, a conducting layer 12 is deposited on an insulating layer 10. Conducting layer 12 may be connected through insulating layer 10 to an underlying structure (not shown). A thin layer of photoresist 14 is spun on over conducting layer 12, exposed through a mask pattern and developed, such that the photoresist layer 14 contains gaps 16 where conducting layer 12 is to be removed. Referring now to FIG. 1B, conducting material has been removed using an etching process which removes material below gaps in the photoresist layer to create patterned conductors 18 separated by gaps 20. The photoresist 14 of FIG. 1A has also been stripped and does not appear in FIG. 1B. FIG. 1C shows additional layers added to the structure. An organic-containing dielectric layer 22 fills the gaps 20 of FIG. 1B, as well as covering patterned conductors 18 with a thickness about 110% of the conductor height as measured in the gap between conductors. This organic-containing dielectric layer may be made out of a spun-on glass (SOG) which contains a polymer (Allied Signal 500 Series, for example), which is annealed at a temperature of approximately 400 degrees C. for 30 minutes An inorganic dielectric layer 24, made of silicon dioxide for instance, is deposited over the organic-containing dielectric layer 22, and then planarized, e.g. using a chemical-mechanical polisher. A new layer of photoresist 26 is then deposited over the inorganic dielectric layer 24. A via 28 is shown after mask patterning and developing of photoresist layer 26, and after anisotropic etch of inorganic dielectric layer 24. It is important that this step be completed with an etch process which will not appreciably etch the organic-containing dielectric layer 22, such as fluorocarbon etchants in a high density plasma for the organic-containing example Allied Signal 500 Series. Finally, referring to FIG. 1D, a short anisotropic etch of the organic-containing dielectric layer 22 extends the via 28 down to the patterned conductor 18. The via 28 is purposely drawn misaligned slightly to the left of the conductor 18 to illustrate one of the advantages of this invention. Without the organic-containing dielectric layer 22 acting as an etch stop, the etch through the relatively thick inorganic dielectric layer 24 generally would have created a large void extending down the side of conductor 18. This void can not only cause mechanical problems, but also, if subsequently filled with metal, decrease the distance (and therefore increase the capacitance) between the conductor and its adjacent neighbor. The etch through the thick inorganic dielectric, which is stopped by the organic-containing dielectric, followed by a short, controllable etch of the organic-containing dielectric, results in a via which, even if misaligned, stops essentially at the top level of the conductor. This self-aligning feature of the invention, combined with the added advantage of a low-k material between adjacent conductors, results in lower capacitance between adjacent conductors and higher reliability for the overall metal system For several reasons, the dielectric constant of the inorganic dielectric layer is not as critical as that maintained between conductors on the same level. First, the inorganic dielectric layer can be made relatively thick compared to the spacing between conductors on the same level. Secondly, two layers of conductors can generally be fabricated such that conductors which over or underly each other do not run parallel for large distances. This observation leads to another advantage of the invention; the inorganic dielectric layer, which can be essentially all of the interlayer dielectric, can be composed of a material which is not low-k (silicon dioxide, for example) to provide excellent heat transfer and structural rigidity while still maintaining adequate electrical isolation between the layers of conductors.

Figure 2:
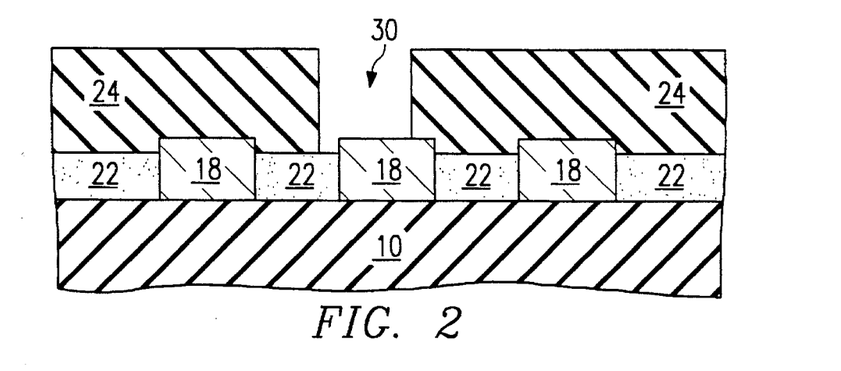
FIG. 2 is a cross-sectional view of another embodiment, in which the organic-containing layer substantially fills the space between the patterned conductors, but does not cover them.

FIG. 2 shows an alternate embodiment in which the process steps have been altered to produce a different structure. In this embodiment, after the organic-containing layer 22 has been deposited and annealed, it is etched back such that the tops of the conductors 18 are exposed. The thickness of the organic-containing layer 22 preferably remains close to the thickness of the conductors 18, perhaps 90%, to keep the capacitance between the conductors low. The inorganic dielectric layer 24 is deposited and etched as in the first embodiment, except now the etch of the inorganic dielectric layer will be stopped by both the organic-containing layer 22 and the conductors 18. The advantages of the first embodiment are retained, but no anisotropic etching of the organic-containing layer is needed to complete the vias.

Figure 3:
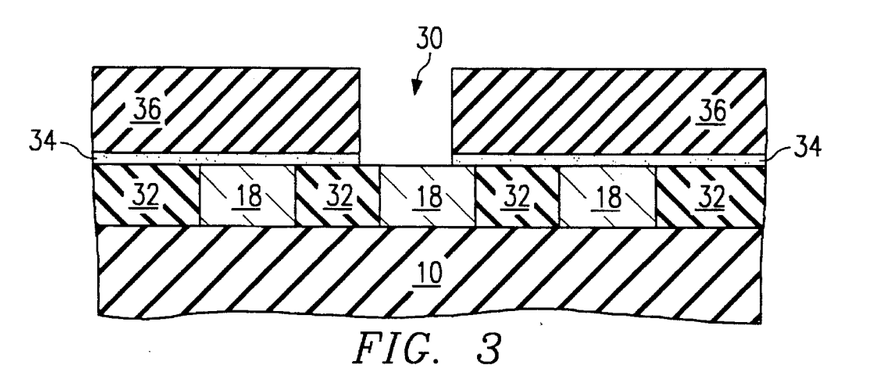
FIG. 3 is a cross-sectional view of yet another embodiment, which employs three dielectric layers, each overlying layer etchable by an etchant to which the underlying layer is selective.

FIG. 3 illustrates another embodiment in which an inorganic low-k dielectric 32 (e.g. a porous oxide) is deposited between patterned conductors 18. An organic-containing cap layer 34, which could be relatively thin, is deposited over this structure. An inorganic dielectric layer 36 is deposited over the organic-containing cap layer 34 to complete the interlayer dielectric. In this arrangement, the organic-containing cap layer 34 acts as an etch stop for the etch of inorganic dielectric layer 36. The inorganic dielectric 32 may also act as an etch stop for the cap layer 34 (although this may not be necessary if cap layer 34 is thin enough). The additional advantages of this embodiment may include an even lower intralayer dielectric constant and a relaxation on the etching properties of an inorganic low-k dielectric layer 32, while maintaining other previously described advantages.

Figure 4:
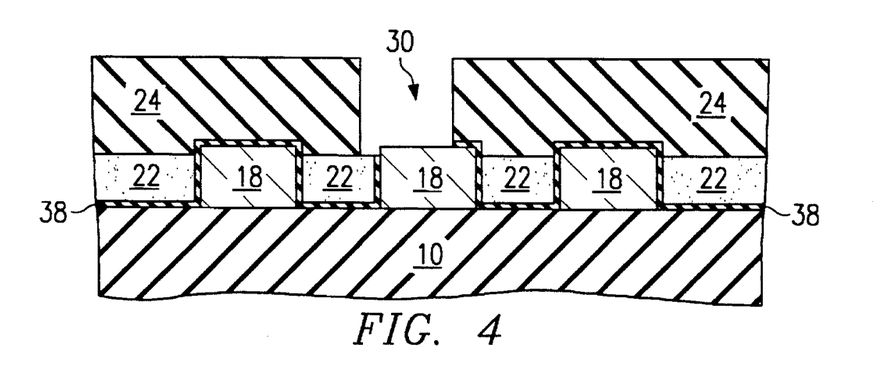
FIG. 4 is a cross-sectional view of yet another embodiment, which illustrates a thin passivation layer covering the patterned conductors and underlying structure, applied before the organic-containing dielectric layer.

FIG. 4 shows still another embodiment of the invention, wherein the conductors 18 and insulating layer 10 are covered by a relatively thin passivation layer 38. Deposition of remaining materials and formation of via 30 are completed as in the embodiment of FIG. 2. However, organic-containing layer 22 may span only a portion of the horizontal gap between conductors 18, since passivation layer 38 is shown covering the sides of the conductors. Also in this embodiment, after the etch of the inorganic dielectric layer 24, a short etch of the passivation layer 38 may be required to clear the bottom of the vias and expose the conductors 18.

Figure 5:
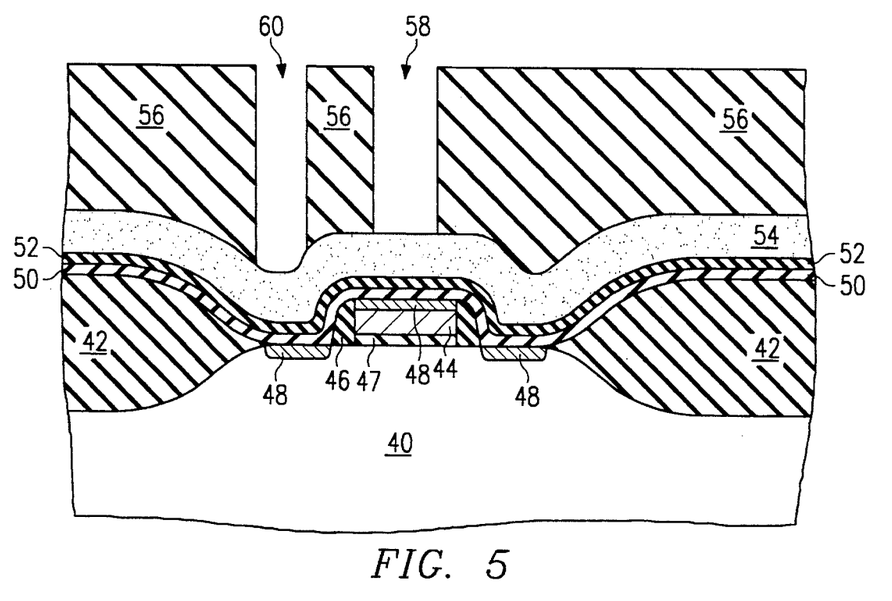
FIG. 5 is a cross-sectional view of still another embodiment, which illustrates a conformal organic-containing layer and a planarized inorganic dielectric layer applied over polysilicon and field oxide, with vias etched through the inorganic dielectric layer towards a poly gate and a source-drain region at a lower elevation.

FIG. 5 shows another embodiment in which the invention is applied to form vias and contact holes to device features at the substrate/polysilicon level. Transistors are formed conventionally on a substrate 40, which is shown with field oxide 42, gate oxide 47, a polysilicon gate 44 with sidewall oxide 46, and with a self-aligned silicide 48 such as titanium silicide formed over the source/drain and gate regions of the device. Over this structure, a thin barrier layer 50 of a material such as TEOS (tetraethoxysilane) and a gettering layer 52 of a material such as BPSG (borophosphosilicate glass) are constructed. Finally, an organic-containing layer 54 is deposited conformally, preferably to a thickness which will adequately fill the space between adjacent polysilicon conductors. An inorganic dielectric layer 56 is deposited over the whole structure and planarized. A partially constructed source/drain contact hole 60 and polysilicon contact hole 58 are depicted to illustrate further advantages of this embodiment. The gate contact would normally be made over the field oxide, although contacts to bipolar polysilicon emitters are often made directly over the active device region. The etch stop property of organic-containing layer 54 enables the etch of the inorganic dielectric layer 56 to form contact holes of unequal length (as is typically the case due to the inherent device topography). For example, during etching the poly contact 58 will reach the organic-containing layer 54 well before source/drain contact hole 60 does, and yet the etching of poly contact 58 will stop instead of overetching deeply layer 54 (or even into the poly gate). A subsequent etch through substantially equal thicknesses of organic-containing layer 54 can then proceed to complete the contact holes. This embodiment extends the method to illustrate another advantage, a reduction in capacitance between neighboring polysilicon conductors at the gate level.

Figure 6:
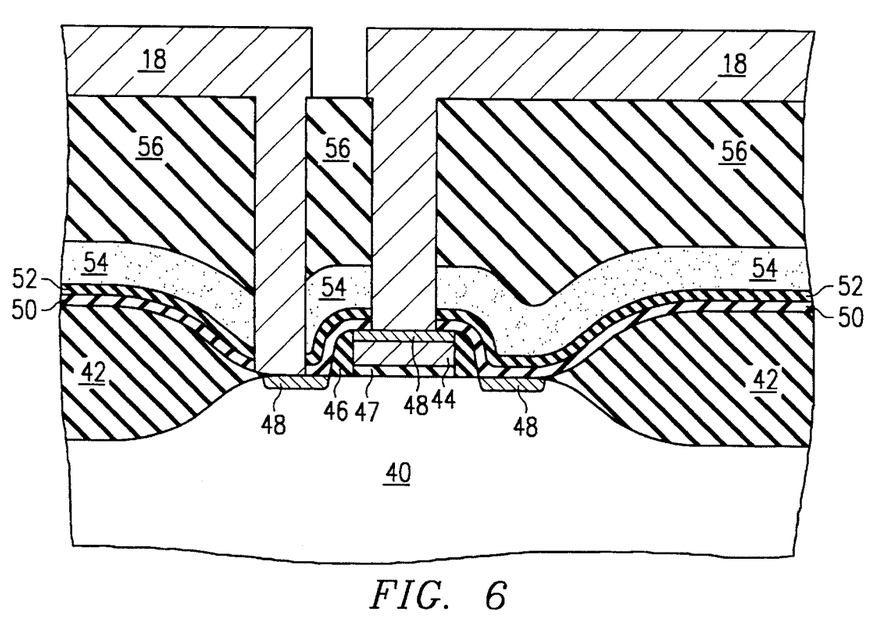
FIG. 6 is a cross-sectional view of the embodiment of FIG. 5, after the vias have been opened to the silicided contacts, filled with a conducting material, and electrically connected to a second layer of patterned conductors.

FIG. 6 shows the structure of FIG. 5, with via 58 and contact hole 60 etched through the organic-containing layer 54, the gettering layer 52, and the barrier layer 50 to expose the contact layer silicide 48. A conducting material (a Ti/TiN/AlCu alloy, for example) is deposited in the contact holes, electrically connecting the silicide contacts 48 to patterned conductors 18 which are formed overlaying inorganic dielectric layer 56.

Figure 7:
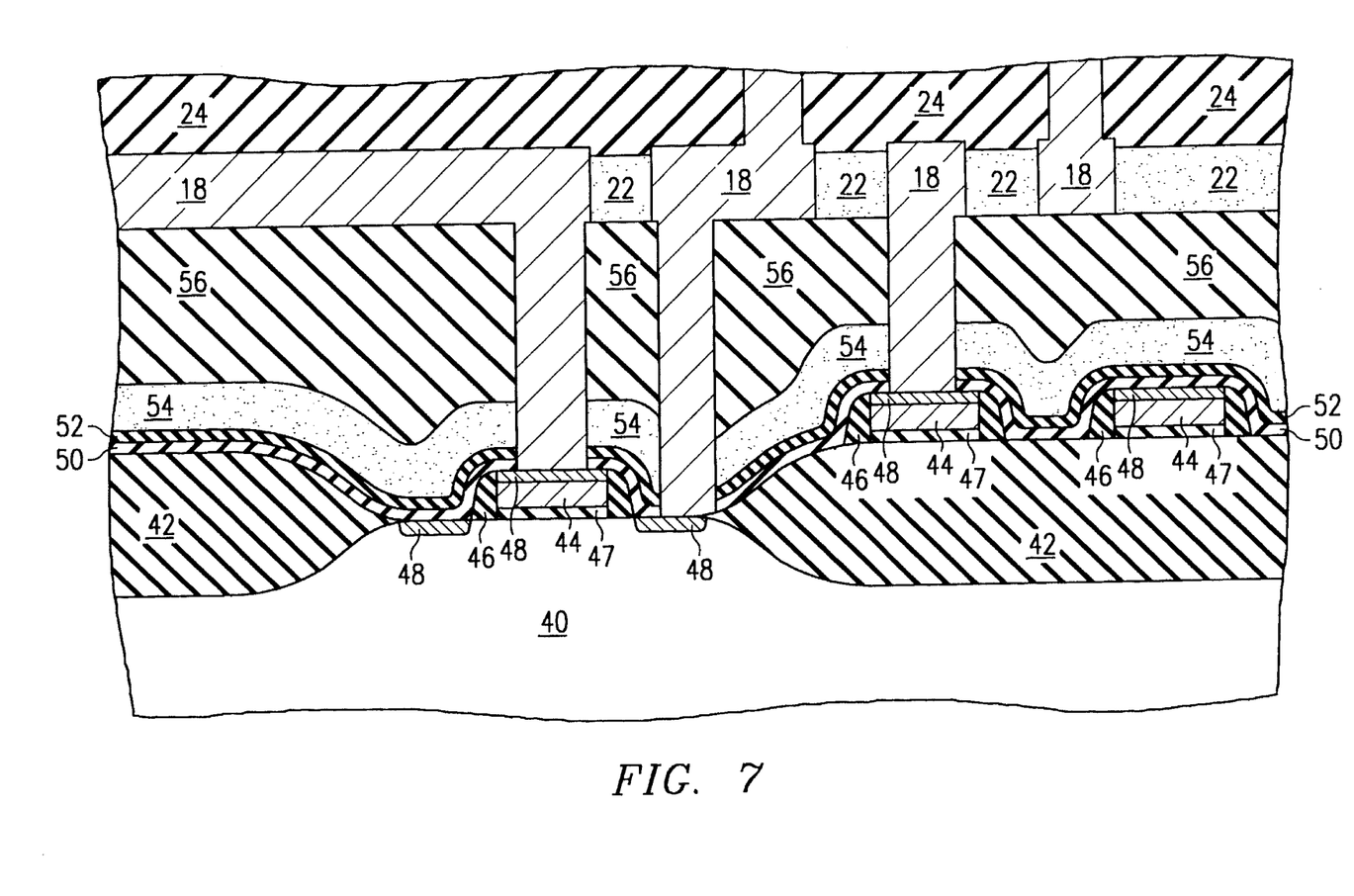
FIG. 7 is a cross-sectional view of an embodiment containing conformal and planarized organic-containing layers on the same semiconductor device.

FIG. 7 shows an embodiment of the invention which illustrates how the various features and advantages of the invention may be employed on multiple layers of patterned conductors. On the left side of FIG. 7 is a structure similar to that of FIG. 6. On the right side, two additional polysilicon conductors 44 are shown on top of the field oxide 42, with a conformal organic-containing layer 54 substantially filling the space between the two conductors. The inorganic dielectric layer 56 is depicted with contacts of several different lengths passing through it. The patterned conductors 18 of an interconnection layer are shown overlaying the inorganic dielectric layer 56, with filled contacts connecting the patterned conductors 18 downwards to silicided contacts 48 and filled vias connecting conductors 18 upwards to a third layer of patterned conductors (not shown). The gaps between the patterned conductors 18 are substantially filled with an organic-containing dielectric layer 22, and capped with an inorganic interlayer dielectric 24.

The following table provides an overview of some embodiments and the drawings.

TABLE

| Drawing Element | Preferred or Specific Examples | Generic Term | Other Alternate Examples |
| --- | --- | --- | --- |
| 10 | Silicon dioxide | Interlayer dielectric | Other oxides, P-glass, inorganic dielectric from previous application of invention |
| 12, 18 | AlCu alloy with Ti and/or TiN underlayers | Patterned condutors | Al, Cu, Mo, W, Ti, and alloys of these Polysilicon, silicides, nitrides, carbides |
| 14, 26 | | Photoresist | |
| 22, 34, 54 | Polymeric SOG (spun-on glass), polymers | Organic-containing dielectric layer | Allied Signal 500 Series, Teflon, parylene, polyimides |
| 24, 36, 56 | Silicon dioxide | inorganic dielectric layer | Other oxides, doped $SiO_2$, P-glass, silicon nitride Particular examples should be paried with organic-containing |

TABLE-continued

| Drawing Element | Preferred or Specific Examples | Generic Term | Other Alternate Examples |
|---|---|---|---|
| | | | examples to provide etchant selectivity |
| 32 | Porous oxide | Low-k inorganic dielectric layer | other porous dielectrics |
| 38 | Silicon nitride | Passivation layer | Oxides, oxynitrides |
| 40 | Silicon | Substrate | Compound semiconductors (e.g. GaAs, InP, Si/Ge, SiC) Ceramic substrates |
| 42 | $SiO_2$ | Field oxide | Other oxides |
| 44 | Polycrystalline silicon | Polysilicon | Polycides, refractory metals |
| 46 | $SiO_2$ | Gate side oxide | $Si_3N_4$ |
| 47 | $SiO_2$ | Gate oxide | Oxynitrides |
| 48 | Titanium disilicide | Contact layer | Other silicides |
| 50 | TEOS | Barrier layer | oxides, nitrides, oxynitrides |
| 52 | BPSG | Gettering layer | PSG, BSG |

The invention is not to be construed as limited to the particular examples described herein, as these are to be regarded as illustrative, rather than restrictive. The invention is intended to cover all processes which do not depart from the spirit and scope of the invention. For example, it would be immediately obvious to one skilled in the art that the relative thicknesses and spacings depicted in the examples could be varied to enhance certain aspects of the invention, or that additional layers could be added by a similar process. Properties of some of the specific examples may be combined without deviating from the nature of the invention.

What is claimed is:

1. A method of fabricating vias for electrical connections between layers on semiconductor devices, said method comprising:

(a) forming a layer of patterned conductors on a substrate;

(b) forming an organic-containing dielectric layer spanning at least 50% of the space between at least two of said patterned conductors, said organic-containing layer having a thickness between 50% and 150% the thickness of said patterned conductors, as measured in the gap between said conductors, said organic-containing layer having a dielectric constant of less than 3.5;

(c) depositing an inorganic dielectric layer covering said organic-containing dielectric layer and any exposed portions of said conductors such that said inorganic dielectric forms the majority of an interlayer dielectric overlying said conductors; and (d) etching vias through said inorganic dielectric with an etch which is selective to said inorganic dielectric layer; whereby said organic-containing dielectric layer acts as an etch stop and prevents overetching due to mask misalignment or uneven device topography, and whereby the capacitance between adjacent pairs of said conductors is reduced as compared to a silicon dioxide dielectric.

2. The method of claim 1, wherein said layer of patterned conductors is an interconnection layer.

3. The method of claim 2, wherein said interconnection layer is composed of materials selected from the group consisting of: aluminum, copper, titanium, platinum, gold, tungsten, polysilicon, tantalum, TiN, $TiSi_2$, and combinations thereof.

4. The method of claim 2, wherein said step of forming an organic-containing dielectric layer comprises depositing an organic-containing material onto said device and etching back said material to a thickness measured in the gap between conductors of 50% to 95% the thickness of said patterned conductors.

5. The method of claim 2, wherein said step of forming an organic-containing dielectric layer comprises depositing an organic,containing material onto said device and etching back said material to a thickness measured in the gap between conductors of about 90% the thickness of said patterned conductors.

6. The method of claim 2, wherein said step of forming an organic-containing dielectric layer comprises depositing a low-k material onto said device in a manner such that the final thickness of said low-k layer as measured in the gap between conductors is between 105% and 150% the thickness of said patterned conductors.

7. The method of claim 2, wherein said step of forming a low-k dielectric layer comprises depositing an organic-containing material onto said device in a manner such that the final thickness of said organic-containing layer as measured in the gap between conductors is substantially 110% the thickness of said patterned conductors.

8. The method of claim 7, wherein said step of depositing an organic-containing material comprises spinning on an SOG containing 10% to 100% polymer by weight and annealing at a temperature of greater than 300 degrees C.

9. The method of claim 1, wherein said organic-containing dielectric layer is composed of a material containing 10% to 100% polymer by weight.

10. The method of claim 9, wherein said inorganic dielectric layer is composed of more than 95% silicon dioxide, silicon nitride, or combinations thereof.

11. The method of claim 1, wherein said organic-containing layer is comprised of at least two sublayers, including an organic-coming sublayer capping an inorganic sublayer deposited only between said conductors, said inorganic sublayer having a dielectric constant of less than 3.0.

12. The method of claim 11, wherein said inorganic low-k sublayer is composed of a porous oxide.

13. The method of claim 11, further comprising etching said vias through said organic-containing sublayer, with an second etchant which is selective to said organic-containing sublayer, whereby said inorganic sublayer acts as an etch stop.

14. The method of claim 1, further comprising forming one or more relatively thin passivation layers over said patterned conductors, prior to formation of said organic-containing dielectric layer.

15. The method of claim 1, wherein said layer of patterned conductors is a polysilicon layer, said polysilicon layer also forming the top plate of gates on field effect transistors integrated into said semiconductor device.

16. The method of claim 15, wherein said organic-containing dielectric layer is deposited conformally over said patterned conductors and said substrate.

17. The method of claim 15, wherein conductors are formed in said vias to provide electrical contacts to said polysilicon layer as well as to source-drain regions of said semiconductor device.

18. A method of fabricating vias for electrical connections between layers on semiconductor devices, said method comprising:

(a) forming a layer of patterned conductors on a substrate;

(b) forming an organic-containing dielectric layer spanning at least 50% of the space between at least two of said patterned conductors, said organic-containing layer having a thickness between 50% and 110% the thickness of said patterned conductors, as measured in the gap between said conductors, said organic-containing layer having a dielectric constant of less than 3.5;

(c) depositing an inorganic dielectric layer covering said organic-containing dielectric layer and any exposed portions of said conductors such that said inorganic dielectric forms the majority of an interlayer dielectric overlying said conductors; and (d) etching vias through said inorganic dielectric with an etch which is selective to said inorganic dielectric layer; whereby said organic-containing dielectric layer acts as an etch stop and prevents overetching due to mask misalignment or uneven device topography, and whereby the capacitance between adjacent pairs of said conductors is reduced as compared to a silicon dioxide dielectric.

19. The method of claim 18, wherein said layer of patterned conductors is an interconnection layer.

20. The method of claim 18, wherein said step of forming an organic-containing material comprises spinning on an SOG containing 10% to 100% polymer by weight and annealing at a temperature of greater than 300 degrees C.

* * * * *

UNITED STATES PATENT AND TRADEMARK OFFICE
CERTIFICATE OF CORRECTION

PATENT NO. : 5,565,384
DATED : October 15, 1996
INVENTOR(S) : ROBERT H. HAVEMANN It is certified that error appears in the above-identified patent and that said Letters Patent is hereby corrected as shown below:

TITLE PAGE:

Column 1, add

--Assignee: Texas Instruments Incorporated, Dallas, Texas--.

Column 2, add

--Attorney, Agent, or Firm: James E. Harris, Richard A. Stoltz, and Richard L. Donaldson--.

Signed and Sealed this

Seventeenth Day of February, 1998

Attest:

BRUCE LEHMAN

*Attesting Officer*    *Commissioner of Patents and Trademarks*